(12) United States Patent
Yang et al.

(10) Patent No.: US 11,824,094 B2
(45) Date of Patent: Nov. 21, 2023

(54) SILICON CARBIDE JUNCTION FIELD EFFECT TRANSISTORS

(71) Applicant: Power Integrations, Inc., San Jose, CA (US)

(72) Inventors: Kuo-Chang Robert Yang, Campbell, CA (US); Kamal Raj Varadarajan, Fremont, CA (US); Sorin S. Georgescu, Gilroy, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 17/913,673

(22) PCT Filed: Mar. 25, 2021

(86) PCT No.: PCT/US2021/024090
§ 371 (c)(1),
(2) Date: Sep. 22, 2022

(87) PCT Pub. No.: WO2021/202228
PCT Pub. Date: Oct. 7, 2021

(65) Prior Publication Data
US 2023/0147746 A1    May 11, 2023

Related U.S. Application Data

(60) Provisional application No. 63/001,432, filed on Mar. 29, 2020.

(51) Int. Cl.
*H01L 29/10*    (2006.01)
*H01L 29/16*    (2006.01)
*H01L 29/66*    (2006.01)

(52) U.S. Cl.
CPC ...... *H01L 29/1066* (2013.01); *H01L 29/1058* (2013.01); *H01L 29/1608* (2013.01); *H01L 29/66068* (2013.01)

(58) Field of Classification Search
CPC . H01L 29/0619; H01L 29/06; H01L 29/1058; H01L 29/1068; H01L 29/10;
(Continued)

(56) References Cited

U.S. PATENT DOCUMENTS

2014/0346528 A1* 11/2014 Hisada ............. H01L 29/66037
257/77
2017/0117392 A1* 4/2017 Bhalla ................. H01L 29/1608

FOREIGN PATENT DOCUMENTS

| EP | 0703629 A2 | | 3/1996 |
| JP | 2003243419 | * | 8/2003 |
| JP | 2003243419 A | | 8/2003 |

OTHER PUBLICATIONS

PCT Application PCT/US2021/024090, International Search Report, dated Jul. 8, 2021, 4 pages.
(Continued)

*Primary Examiner* — Fazli Erdem
(74) *Attorney, Agent, or Firm* — Brian H. Floyd

(57) ABSTRACT

Silicon carbide (SiC) junction field effect transistors (JFETs) are presented herein. A deep implant (e.g., a deep p-type implant) forms a JFET gate (106). MET gate and MET source (108) may be implemented with heavily doped n-type (N+) and heavily doped p-type (P+) implants, respectively. Termination regions may be implemented by using equipotential rings formed by deep implants (e.g., deep p-type implants).

11 Claims, 14 Drawing Sheets

(58) Field of Classification Search
CPC .............. H01L 29/1608; H01L 29/16; H01L 29/66068; H01L 29/66; H01L 29/7832; H01L 29/78; H01L 29/8083; H01L 29/80
USPC .......................................................... 257/77
See application file for complete search history.

(56) References Cited

OTHER PUBLICATIONS

PCT Application PCT/US2021/024090, Written Opinion of the International Searching Authority, dated Jul. 8, 2021, 6 pages.
PCT Application PCT/US2021/024090, International Preliminary Report on Patentability, dated Sep. 12, 2022, 3 pages.

* cited by examiner

SILICON CARBIDE JUNCTION FIELD EFFECT TRANSISTORS

CROSS-REFERENCE TO RELATED APPLICATIONS

This application claims the benefit of International Application PCT/US2021/024090 filed on Mar. 25,2021, which claims the benefit of U.S. Provisional Application No. 63/001,432 filed on Mar. 29, 2020, incorporated herein by reference in their entirety.

FIELD OF THE DISCLOSURE

The present disclosure relates generally to semiconductor devices, and more specifically to silicon carbide (SiC) junction field effect transistors (JFETs).

BACKGROUND INFORMATION

Silicon carbide (SiC) was first discovered in 1891 by Edward Acheson as he attempted to find a way to produce artificial diamonds, by heating clay (aluminium silicate) and carbon. He referred to the shiny hexagonal crystals as carborundum. Since that time SiC has evolved into a superior material for fabricating semiconductor devices.

Compared to Silicon (Si), Silicon carbide (SiC) has a higher bandgap and avails superior breakdown strength, thermal conductivity, and maximum current density. Silicon carbide can take on many crystalline forms, one of which, 4H-SiC (a hexagonal crystal structure) is often the polytype of choice for high power devices; and silicon carbide may be doped n-type or p-type. Some n-type dopants include nitrogen and phosphorus; and some p-type dopants include beryllium, boron, aluminum, or gallium.

A junction field effect transistor (JFET) is a gate controlled device whereby electric current is controlled by means of a semiconducting channel between a source and a drain. By applying a reverse bias voltage to a gate terminal, the channel becomes "pinched", whereby electric current is impeded or switched off completely. A JFET usually operates in the on-state (conducts current) when there is no voltage between its gate and source.

BRIEF DESCRIPTION OF THE DRAWINGS

Non-limiting and non-exhaustive embodiments of silicon carbide (SiC) planar gate junction field effect transistors (JFETs) are described with reference to the following figures, wherein like reference numerals refer to like parts throughout the various views unless otherwise specified.

Figure 1A:
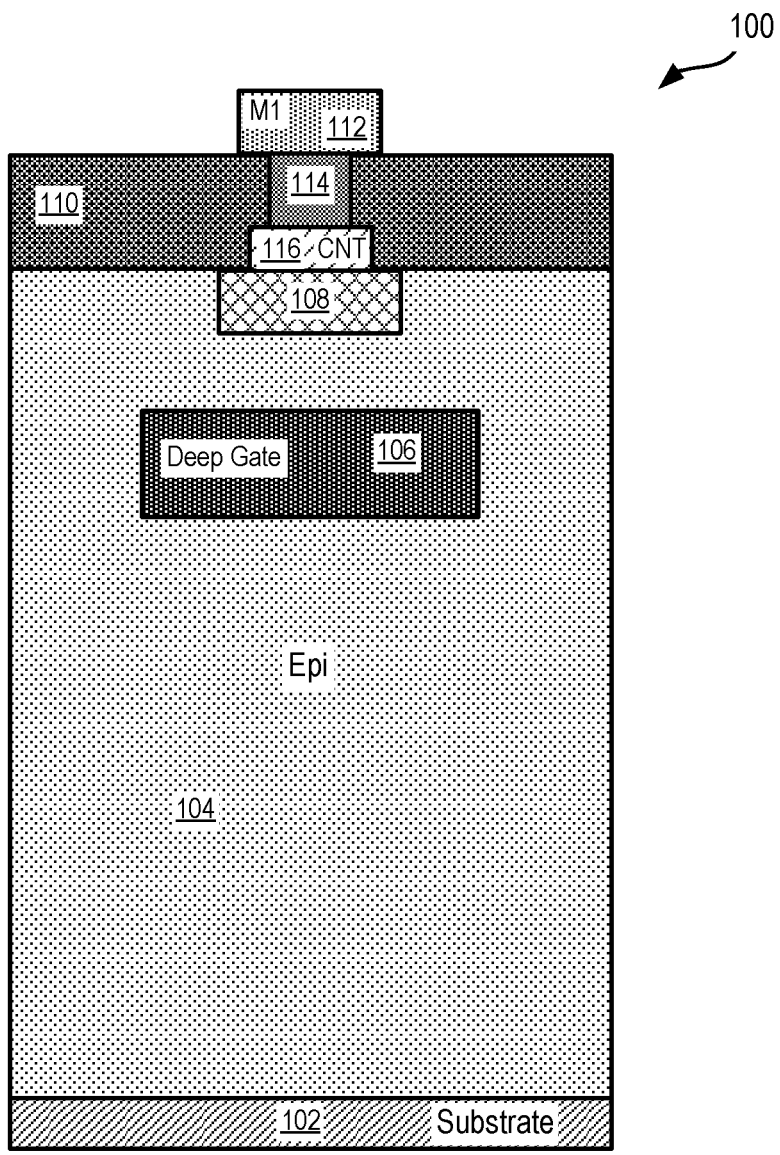
FIG. 1A illustrates a cell device cross section for an active region of a SiC planar gate JFET according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements and layers in the figures may be exaggerated relative to other elements to help to improve understanding of various embodiments of the teachings herein. Also, common but well-understood elements, layers, and/or process steps that are useful or necessary in a commercially feasible embodiment are often not depicted in order to facilitate a less obstructed view of these various embodiments of SiC planar gate JFETs.

DETAILED DESCRIPTION

In the following description, numerous specific details are set forth in order to provide a thorough understanding of SiC planar gate JFETs. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure, method, process, and/or characteristic described in connection with the embodiment or example is included in at least one embodiment of SiC planar gate JFETs. Thus, appearances of the phrases "in one embodiment", "in an embodiment", "one example" or "an example" in various places throughout this specification are not necessarily all referring to the same embodiment or example. Furthermore, the particular features, structures, methods, processes and/or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

In the context of the present application, SiC may refer to various polytypes of SiC including, but not limited to, 4H-SiC. Also, terms commonly used in the field of semiconductors and semiconductor device fabrication may be relied upon to describe features of SiC planar gate JFETs. For instance, the terms "shallow" and "deep" may refer to depth of a junction and/or an implanted dopant region; and support for the definition of "shallow" and "deep" is conveyed by the drawings showing (cell) device cross sections for embodiments of SiC planar gate JFETs.

Further, when a transistor is in an "off-state" or "off" the transistor blocks current and/or does not substantially conduct current. Conversely, when a transistor is in an "on-state" or "on" the transistor is able to substantially conduct current. Also, for purposes of this disclosure, "ground" or "ground potential" refers to a reference voltage or potential against which all other voltages or potentials of an electronic circuit, device, or Integrated circuit (IC) are defined or measured.

Throughout the specification there may be reference to semiconductor device and/or process simulations using technology computer aided design (TCAD). "TCAD simulations" or "TCAD device simulations" or "Synopsys Sentaurus TCAD device and process simulations" refers to simulations using SYNOPSYS® tools. (SYNOPSYS® is a trademark of Synopsys, Inc., 690 East Middlefield Road, Mountain View, Calif. 94043)

As described above, SiC may be used as a semiconductor device material for fabricating semiconductor devices. The crystalline structure of SiC can be 4H-SiC polytype; however, other types may be possible (e.g., a 6H-SiC polytype). These polytypes of SiC have opened areas of research in the high power device arena; and there is an ongoing need to develop new SiC junction field effect transistors suitable for high voltage operation.

Silicon carbide (SiC) planar gate junction field effect transistors (JFETs) are presented herein. A deep implant (e.g., a deep p-type implant) may form a JFET gate. Connections to the JFET gate and JFET source may be implemented with alternating heavily doped n-type (N+) and heavily doped p-type (P+) implants, respectively. Termination regions may be implemented by using equipotential rings built with deep implants (e.g., deep p-type implants).

FIG. 1A illustrates a cell device cross section 100 for an active region of a SiC planar gate JFET according to an embodiment. In the following description, the cell device cross section 100 may also be referred to as an active cell 100. The cell device cross section 100 includes a substrate layer 102, an epitaxial (Epi) layer 104, a deep gate 106, a shallow source 108, an oxide layer 110, a metal (M1) pattern 112, a plug layer 114, and a source contact 116. As illustrated, electrical connection to the shallow source 108 is effected with the interconnection of metal pattern 112 with plug layer 114 to the source contact 116. In forming a SiC planar gate JFET, the substrate layer 102, the epitaxial layer 104, and the shallow source 108 may be of the same doping type, opposite to that of the deep gate 106.

Figure 1B:
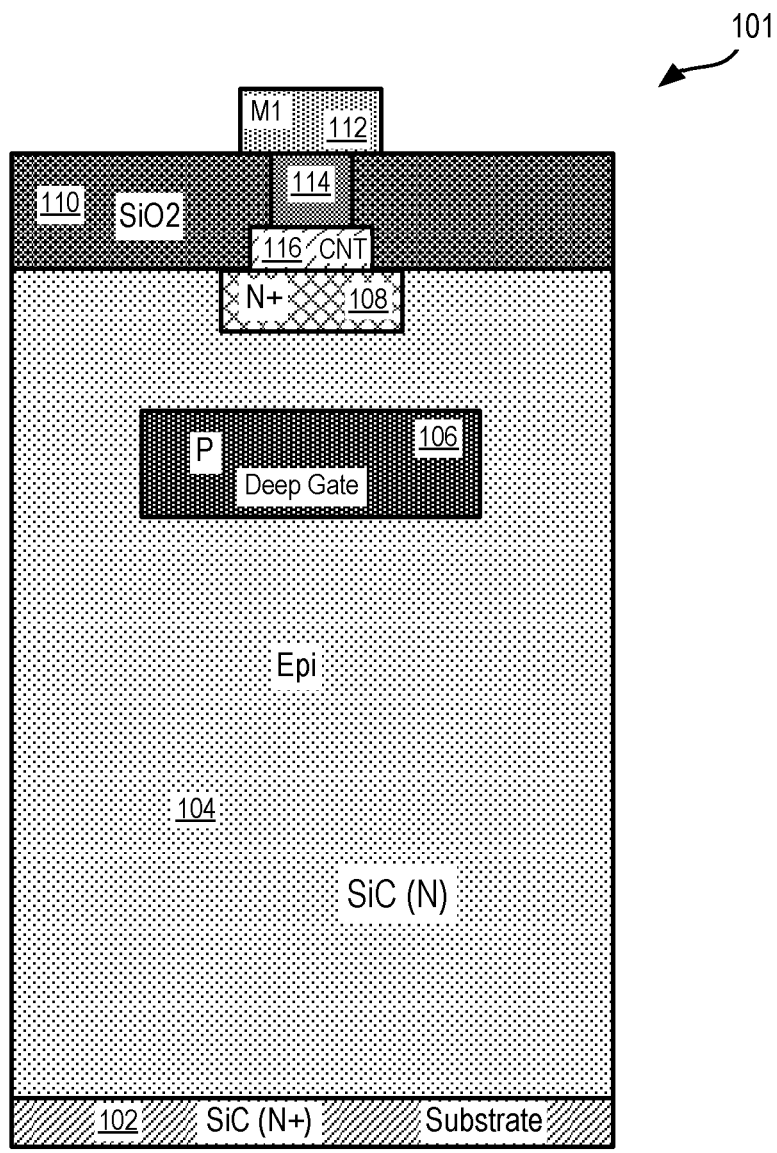
FIG. 1B illustrates a cell device cross section for an active region of a SiC planar gate JFET according to an embodiment.

For instance, FIG. 1B illustrates a cell device cross section 101 for an active region of an n-channel SiC planar gate JFET according to an embodiment of FIG. 1A. In the embodiment of cell device cross section 101, the substrate layer 102 is a heavily doped n-type (N+) SiC substrate layer 102. The epitaxial layer 104 is a SiC n-type (N) epitaxial layer 104. The shallow source 108 is heavily doped n-type (N+); and the oxide 110 comprises silicon dioxide ($SiO_2$) which may be formed by a thermal and/or chemical vapor deposition (CVD) process step.

Figure 1C:
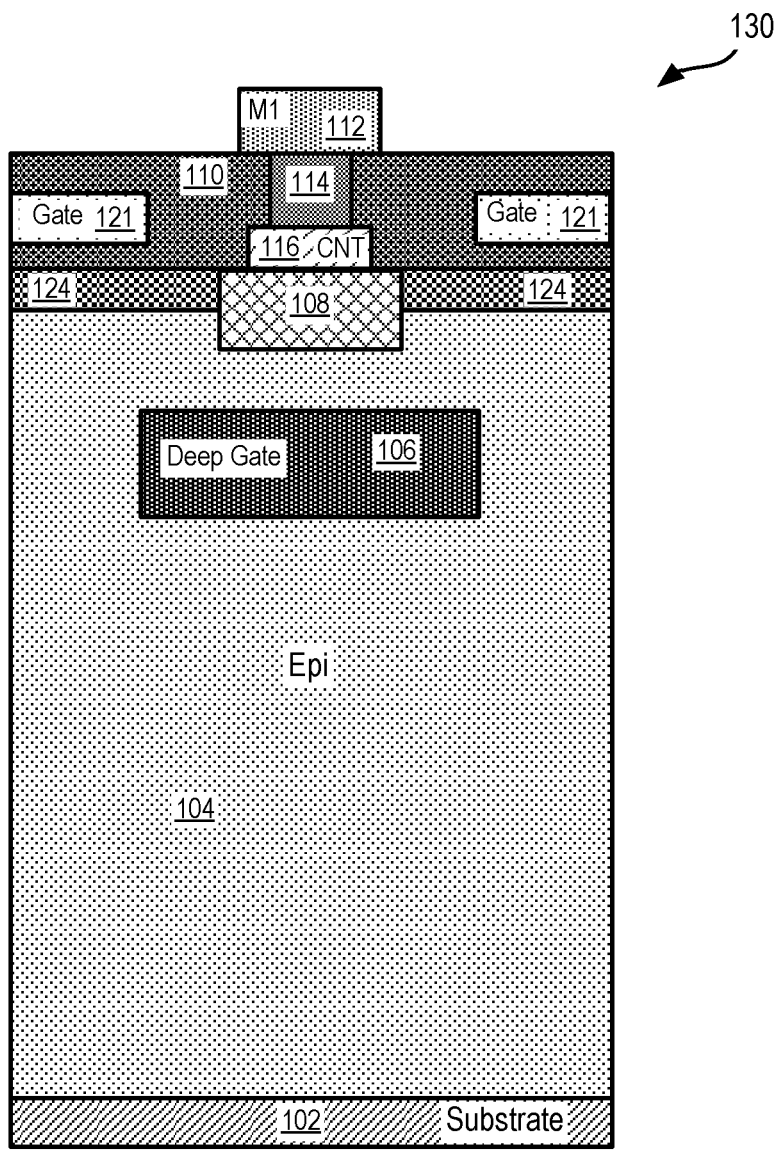
FIG. 1C illustrates a cell device cross section for an active region of a SiC planar gate JFET according to an embodiment.

FIG. 1C illustrates a cell device cross section 130 for an active region of a SiC planar gate JFET according to an embodiment. Cell device cross section 130 is similar to cell device cross sections 100, except it further comprises polysilicon (poly) gate 121 patterned to be electrically coupled with the deep gate 106. For instance, FIG. 1E illustrates an embodiment whereby the poly gate 121 is electrically coupled to the deep gate 106. Additionally, a shallow layer 124, having the same doping type as the shallow source 108 and the epitaxial layer 104 (e.g., n-type), is implanted at (or near) the surface of the cell device cross section 130. The poly gate 121 may advantageously improve JFET device characteristics (e.g., allow enhanced gate control of a pinch-off voltage); and the shallow layer 124 may advantageously improve (reduce) on resistance.

Figure 1D:
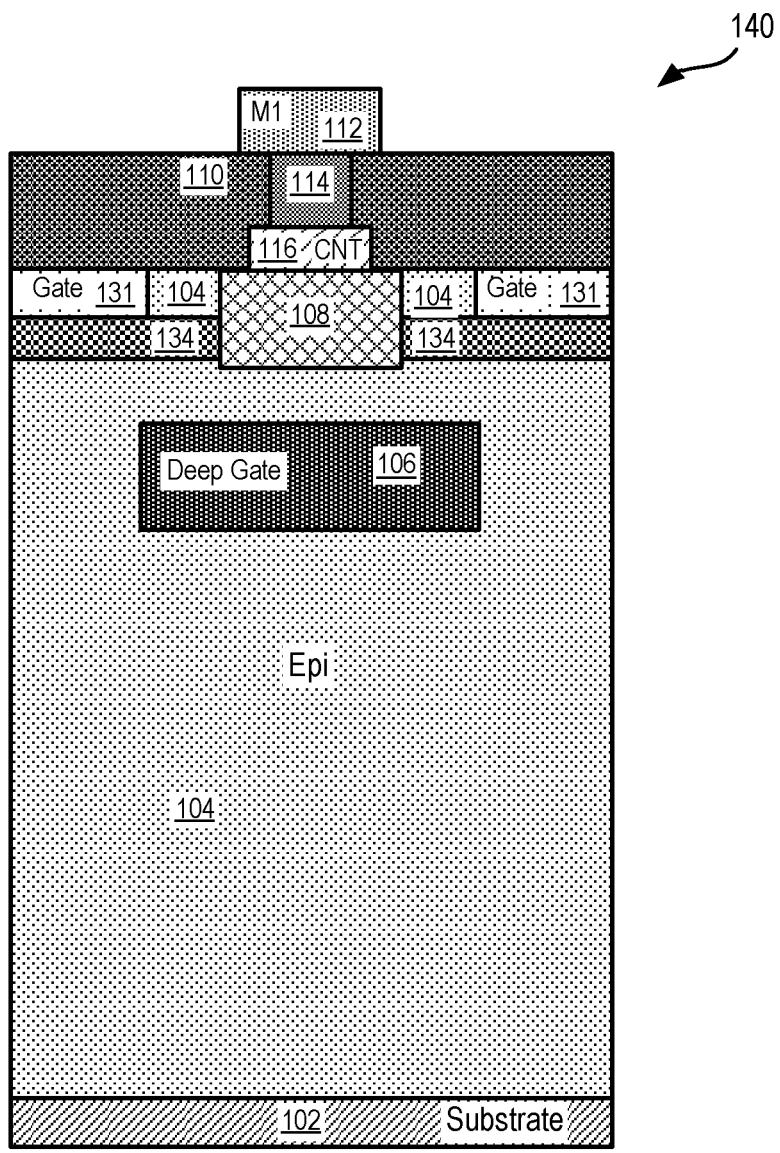
FIG. 1D illustrates a cell device cross section for an active region of a SiC planar gate JFET according to an embodiment.
Figure 1E:
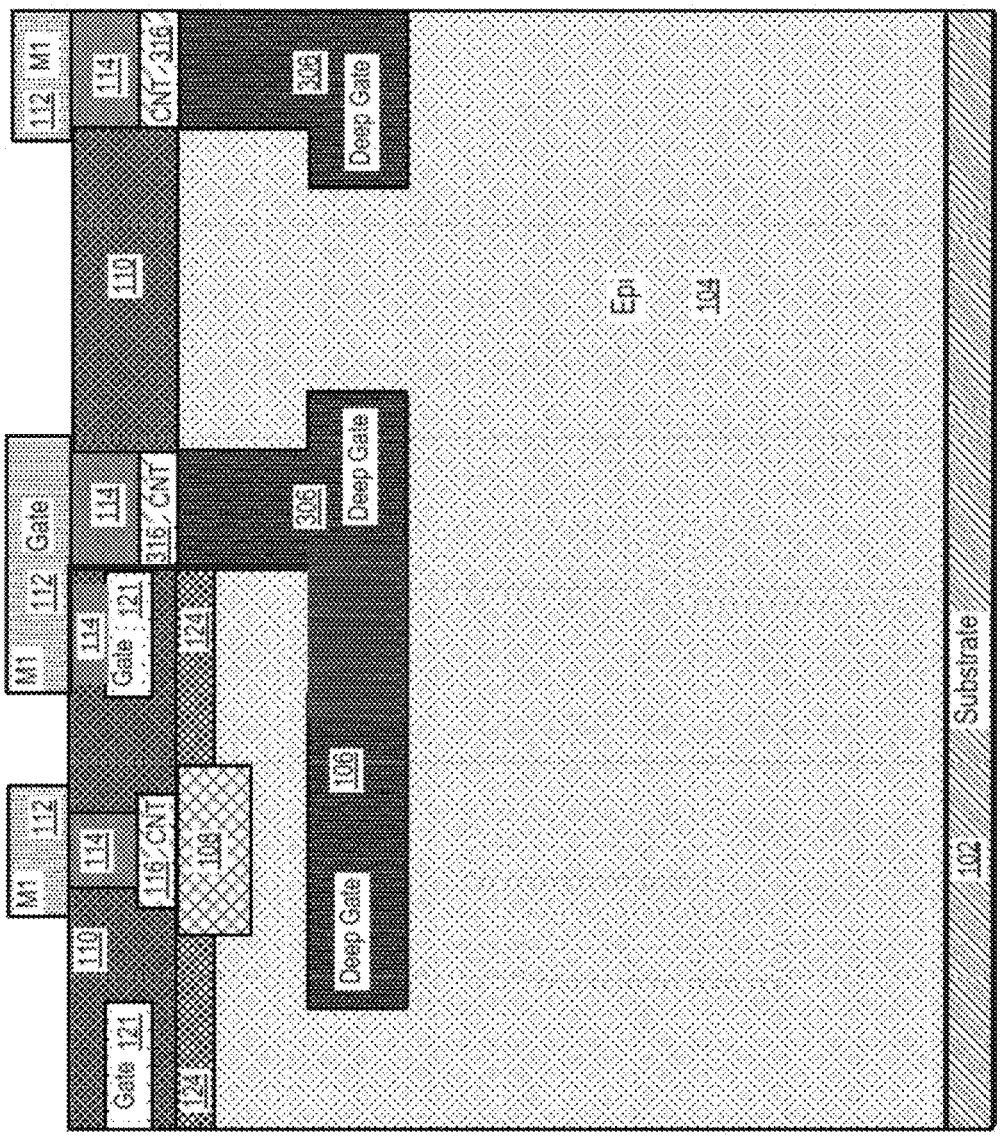
FIG. 1E illustrates electrical coupling of the deep gate and polysilicon gate according to an embodiment.

FIG. 1D illustrates a cell device cross section 140 for an active region of a SiC planar gate JFET according to an embodiment. Cell device cross section 140 is similar to cell device cross sections 100, except it further comprises surface gate 131 implanted at or near the surface of cell device cross section 140. Surface gate 131 may be of the same doping type as the deep gate 106 (e.g., p-type) and may be electrically coupled with the deep gate 106. Additionally, a shallow layer 134, having the same doping type as the shallow source 108 and the epitaxial layer 104 (e.g., n-type), is implanted at (or near) the surface of the cell device cross section 140. The gate 131 may advantageously improve JFET device characteristics (e.g., allow enhanced gate control of a pinch-off voltage); and the shallow layer 134 may advantageously improve (reduce) on resistance.

Figure 2:
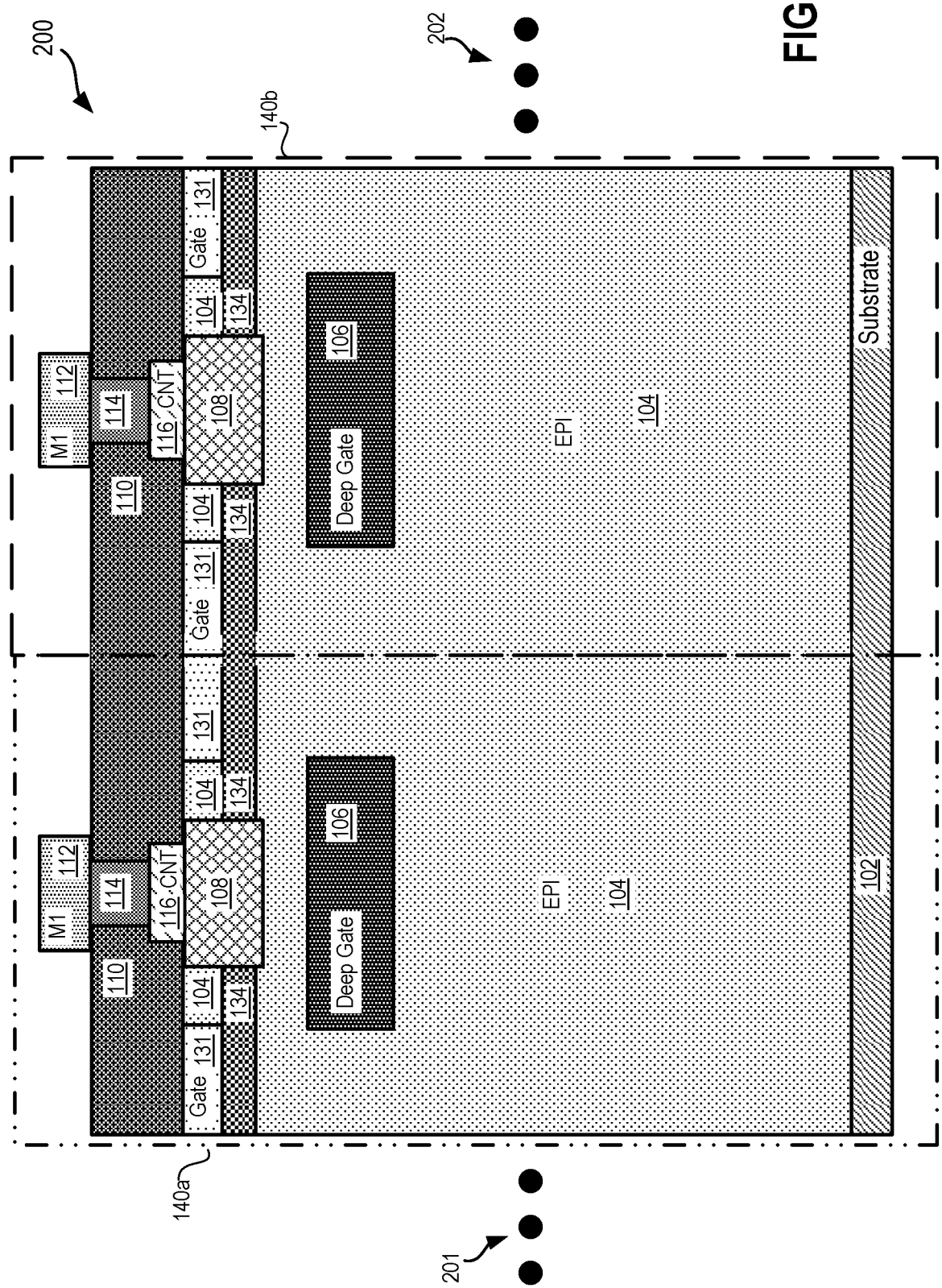
FIG. 2 illustrates a cell placement device cross section for active regions of a SiC planar gate JFET according to an embodiment.

FIG. 2 illustrates a cell placement device cross section 200 for active regions of a SiC planar gate JFET according to an embodiment. As illustrated, in forming a SiC planar gate JFET, more than one (e.g., multiple) cells may formed (e.g., stepped and repeated). For instance the cell placement device cross section 200 shows a cell device cross section 140a adjacent a cell device cross section 140b, both of which may correspond with cell device cross section 140. As indicated by ellipses 201, 202, there may be greater (or fewer) cell device cross sections 140a, 140b.

Figure 3A:
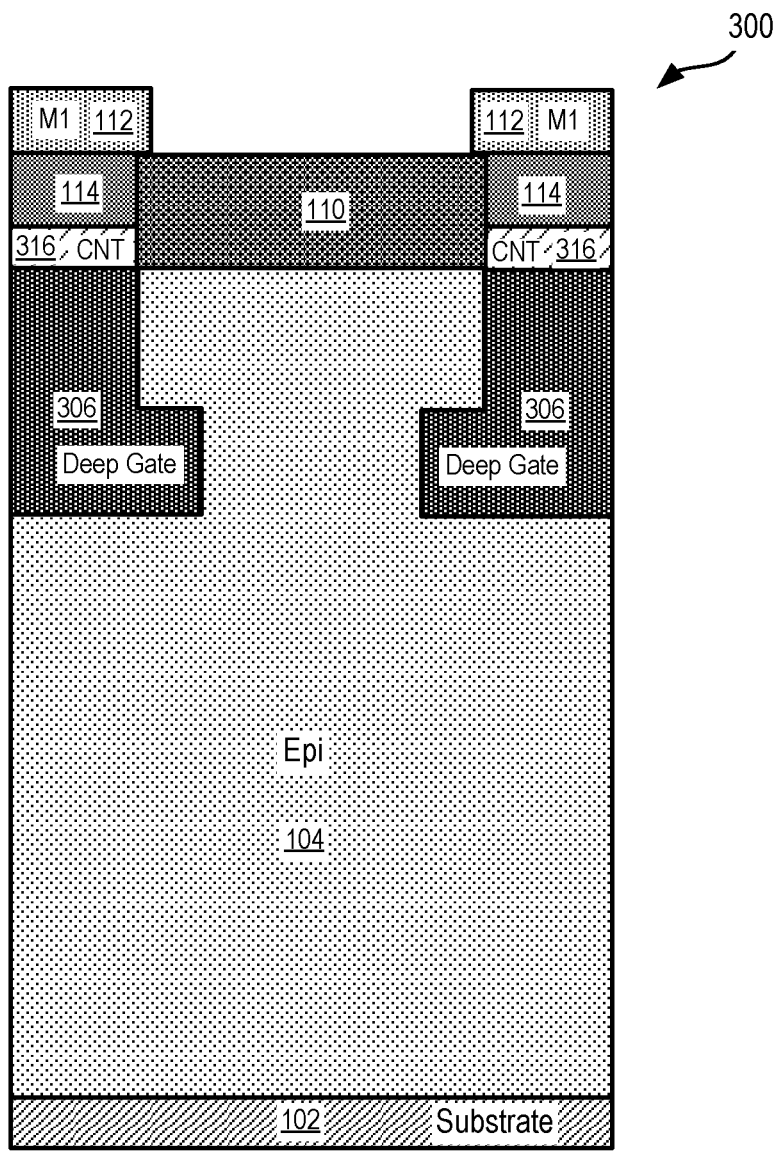
FIG. 3A illustrates a cell device cross section for a termination region of a SiC planar gate JFET according to an embodiment.

FIG. 3A illustrates a cell device cross section 300 for a termination region of a SiC planar gate JFET according to an embodiment. The cell device cross section 300 includes the substrate layer 102 and the epitaxial (Epi) layer 104; however, unlike the previously presented cell device cross sections 100, 101, 130, 140, cell device cross section 300 includes deep gate 306 for forming a termination pattern. As illustrated, electrical connection to the deep gate 306 is effected by interconnecting metal pattern 112 with plug layer 114 to termination contact 316.

As one of ordinary skill in the art may appreciate, a termination pattern may be formed as a pattern of one or more rings at the edge of die in order to spread electric fields and improve breakdown.

Figure 3B:
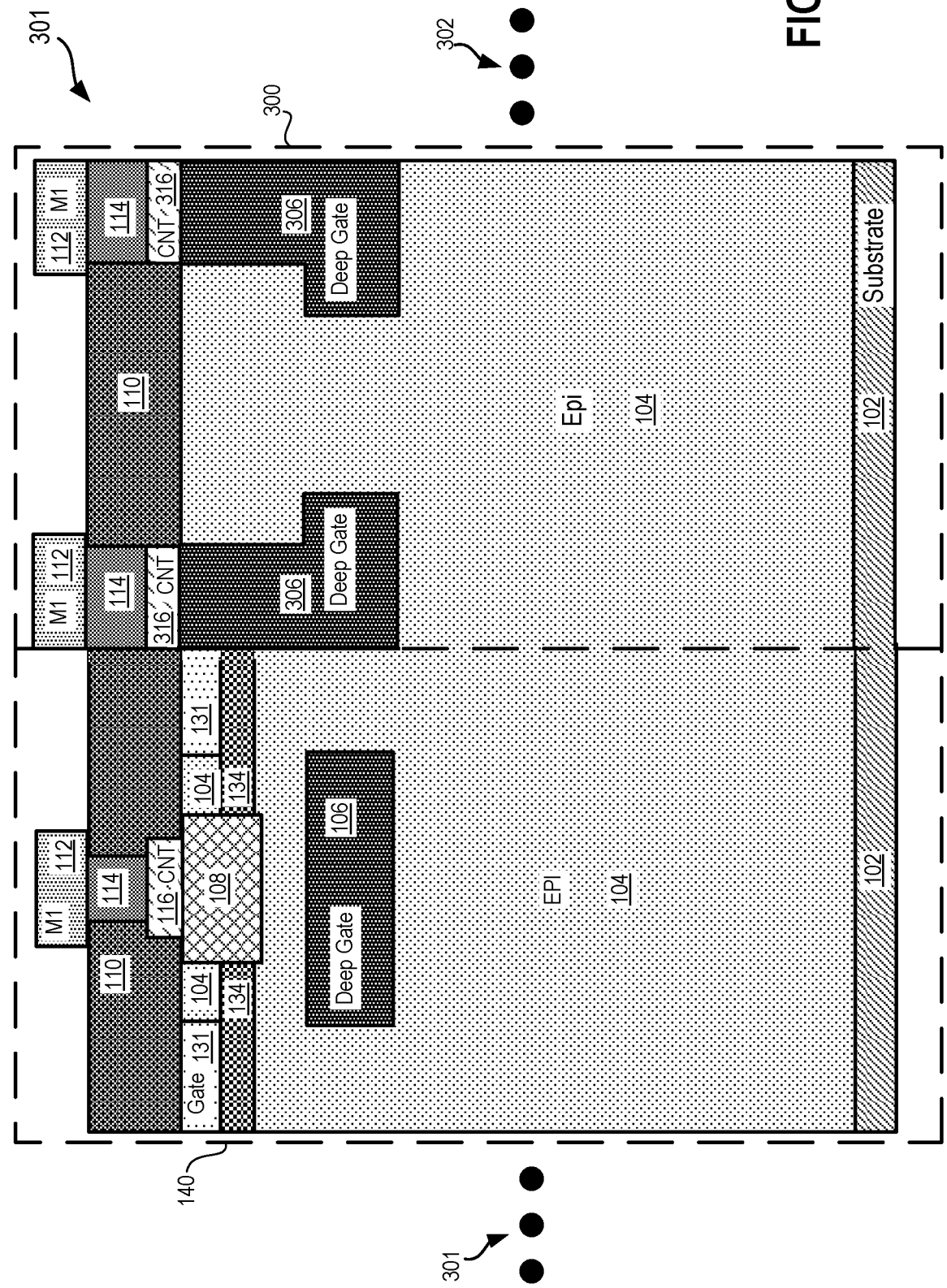
FIG. 3B illustrates a cell placement device cross section for an active region and termination region of a SiC planar gate JFET according to an embodiment.

For instance, FIG. 3B illustrates a cell placement device cross section 301 for an active region and termination region of a SiC planar gate JFET according to an embodiment. As illustrated, cell placement device cross section 301 shows a cell device cross section 140 adjacent a cell device cross section 300. Additionally, deep gate 306 may be of the same doping type as the deep gate 106; and deep gate 306 may electrically float and/or be electrically connected with the deep gate 106. Ellipses 301 indicate there may be greater than one cell device cross section 140 corresponding to an active region; and ellipses 302 indicate that there may be greater than one termination cell device cross section 300.

Figure 4:
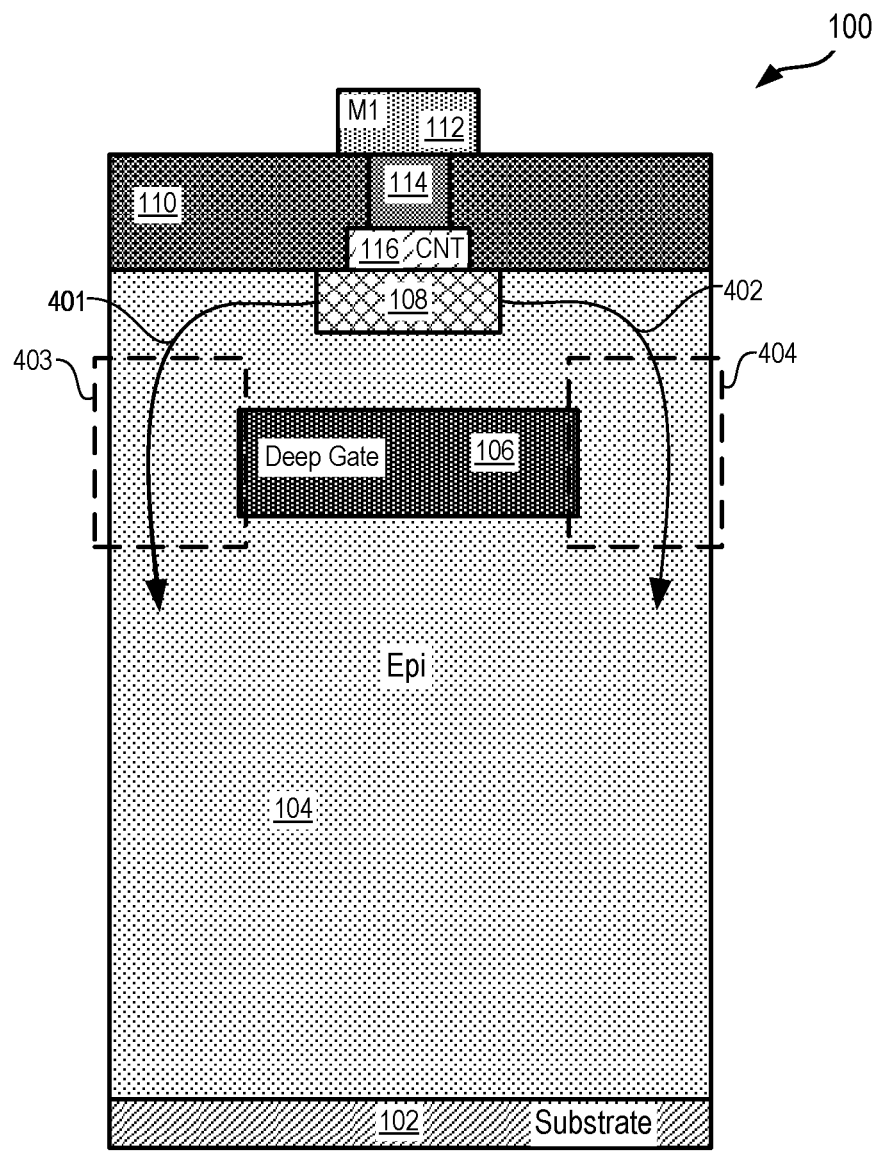
FIG. 4 conceptually illustrates carrier transport in an active region of a SiC planar gate JFET according to an embodiment.

FIG. 4 conceptually illustrates carrier transport in an active region of a SiC planar gate JFET according to an embodiment. As illustrated with respect to the cell device cross section 100, carrier transport (e.g., electron/hole flow) may occur along carrier paths 401 and 402. For instance, in an n-channel JFET configuration (e.g., cell device cross section 101) the carrier is an electron and conventional current flow may be opposite to that of carrier paths 401, 402. As illustrated, a JFET neck 403 and JFET neck 404 may be formed (defined) in the epitaxial layer 104 next to the deep gate 106.

Figure 5A:
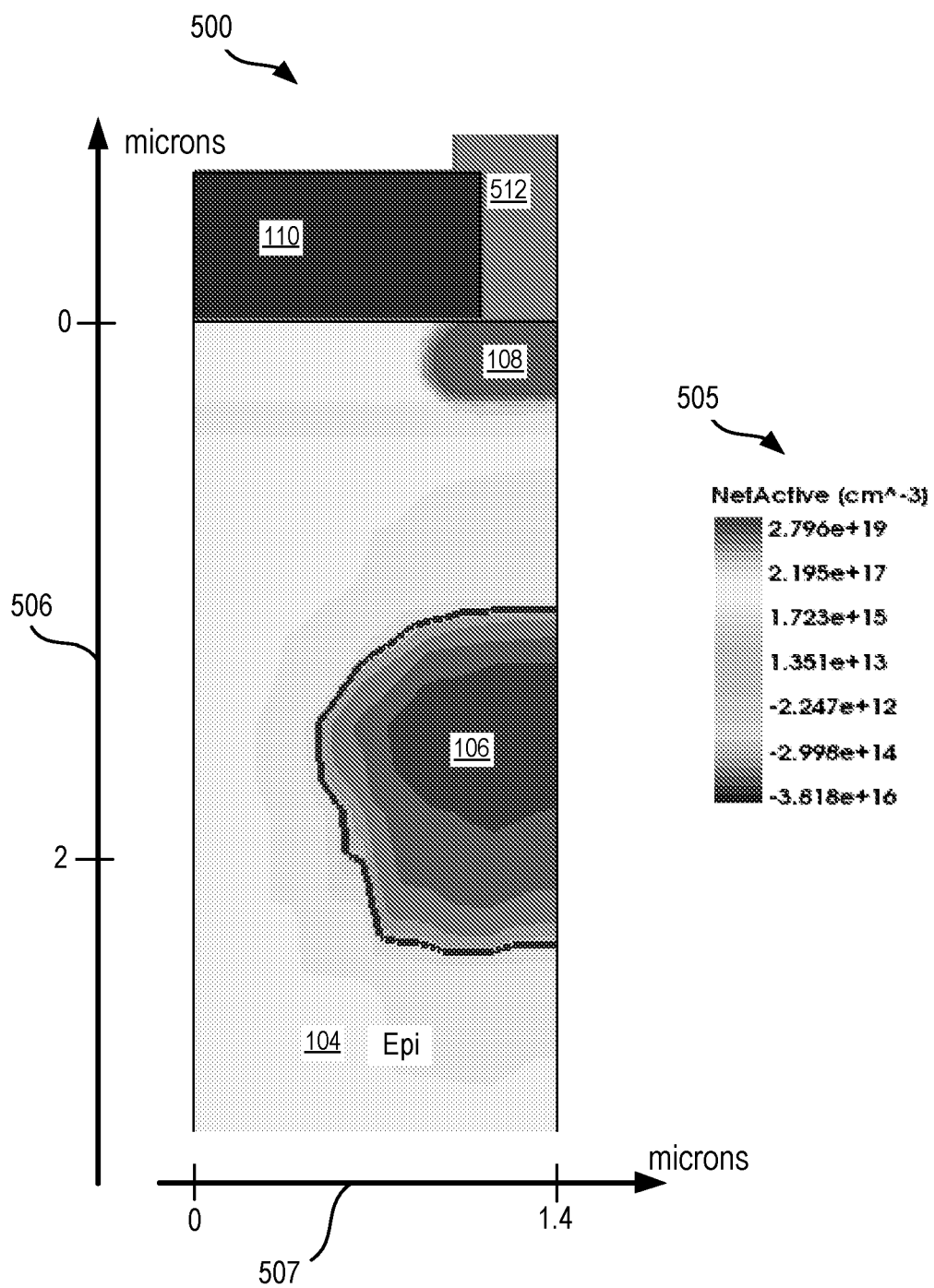
FIG. 5A illustrates a cell device cross section and carrier concentration scale for a Synopsys Sentaurus TCAD device simulation of a SiC planar gate JFET according to an embodiment.

FIG. 5A illustrates a cell device cross section 500 and carrier concentration scale 505 for a Synopsys Sentaurus TCAD device simulation of a SiC planar gate JFET according to an embodiment. Cell device cross section 500 is a plot of a TCAD device structure file corresponding with cell device cross section 100. Device dimensions in microns are illustrated along axes 506-507. Additionally, cell device cross section 500 corresponds with an n-channel JFET configuration. The epitaxy (EPI) layer 104 is n-doped SiC epitaxy layer. The deep gate 106 is formed by implanting aluminum (i.e., a p-type dopant); and the shallow source 108 is formed by implanting nitrogen (i.e., an n-type dopant). Material 512 is similar to metal pattern 112 in making electrical contact to the shallow source 108. TCAD simulations are performed by defining a simulated gate electrode within the deep gate 106, defining a source electrode at the shallow source 108, and defining a drain electrode at the substrate layer 102 (not shown).

With reference to FIG. 4 and to FIG. 5A, the JFET neck 403 and JFET neck 404 may have a lateral dimension (e.g., dimension along axis 506) on the order of one micron. For instance, the JFET neck 403 and JFET neck 404 may have lateral dimension between one-half and two microns.

Figure 5B:
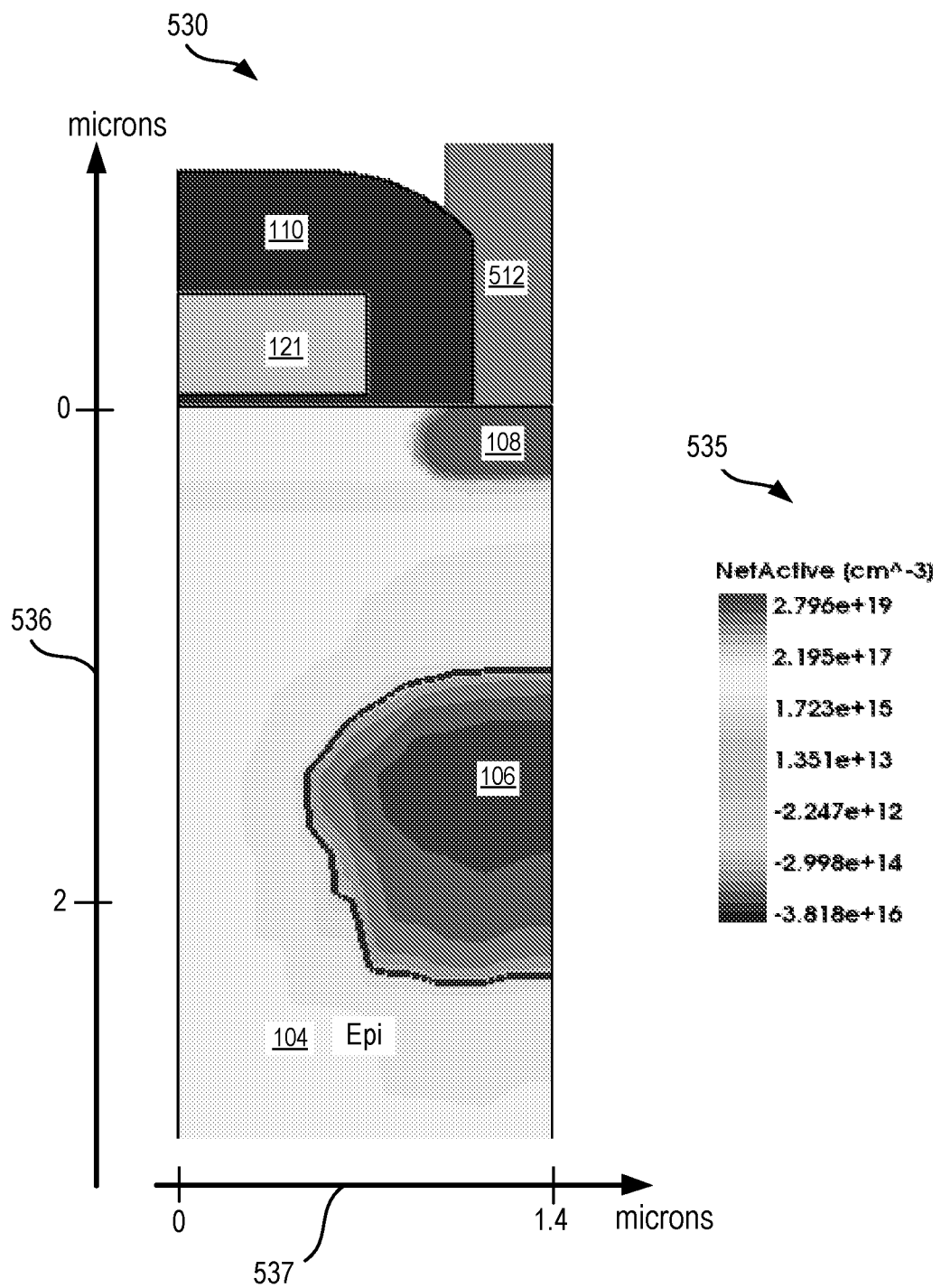
FIG. 5B illustrates a cell device cross section and carrier concentration scale for a Synopsys Sentaurus TCAD device simulation of a SiC planar gate JFET according to an embodiment.

FIG. 5B illustrates a cell device cross section 530 and carrier concentration scale 535 for a Synopsys Sentaurus TCAD device simulation of a SiC planar gate JFET according to an embodiment. Device dimensions in microns are illustrated along axes 536-537. Cell device cross section 530 is a plot of a TCAD device structure file corresponding with cell device cross section 130 which includes poly gate 121. Cell device cross section 530 also corresponds with an n-channel JFET configuration. TCAD simulations are performed by defining a simulated (dual) gate electrode connecting both the deep gate 106 and the poly gate 121, defining a source electrode at the shallow source 108, and defining a drain electrode at the substrate layer 102 (also not shown).

Figure 5C:
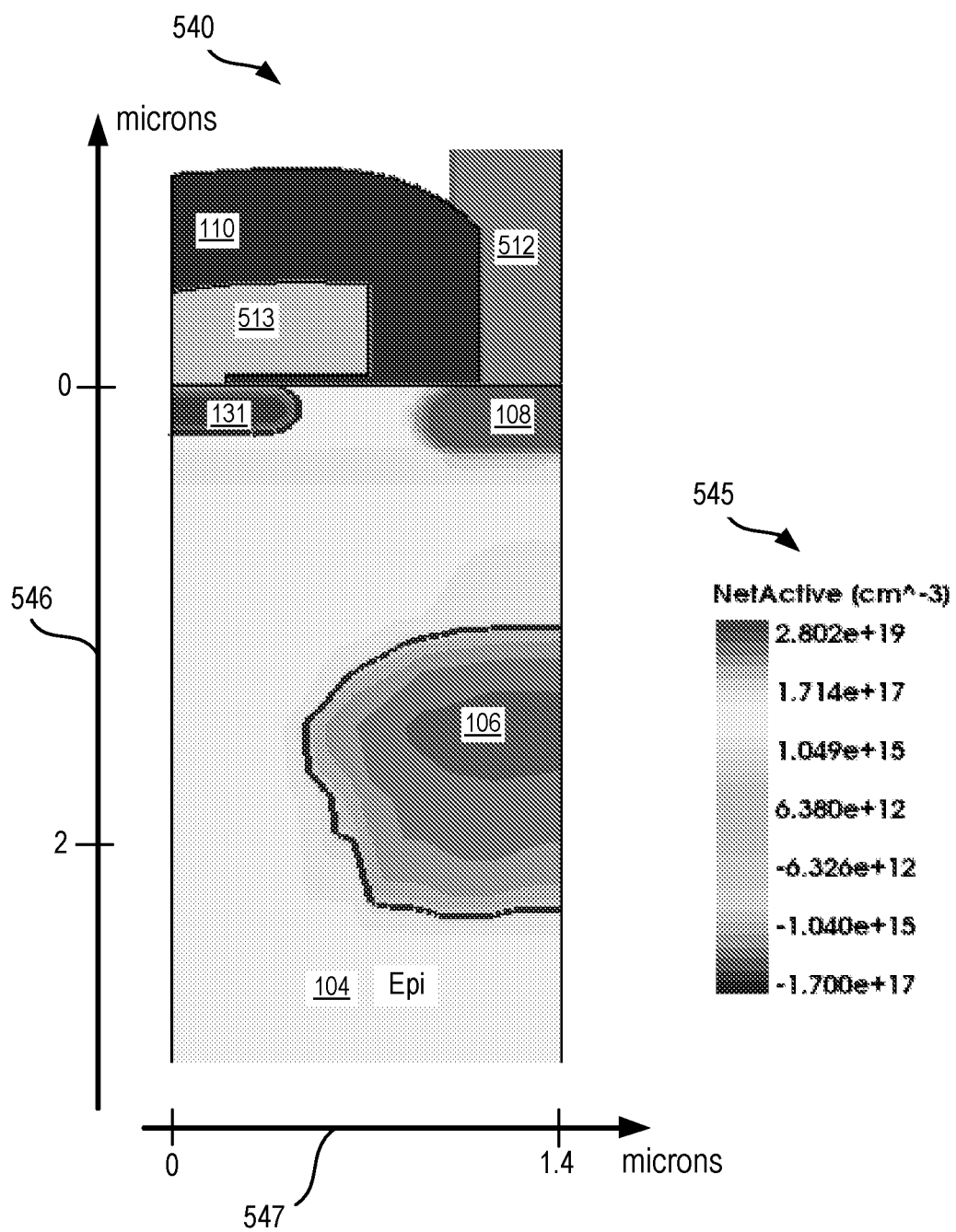
FIG. 5C illustrates a cell device cross section and carrier concentration scale for a Synopsys Sentaurus TCAD device simulation of a SiC planar gate JFET according to an embodiment.

FIG. 5C illustrates a cell device cross section 540 and carrier concentration scale 545 for a Synopsys Sentaurus TCAD device simulation of a SiC planar gate JFET according to an embodiment. Device dimensions in microns are illustrated along axes 546-547. Cell device cross section 540 is a plot of a TCAD device structure file corresponding with cell device cross section 140 which includes surface gate 131. Cell device cross section 540 also corresponds with an n-channel JFET configuration. TCAD simulations are performed by defining a simulated (dual) gate electrode connecting both the deep gate 106 and the surface gate 131, defining a source electrode at the shallow source 108, and defining a drain electrode at the substrate layer 102 (also not shown).

Figure 6:
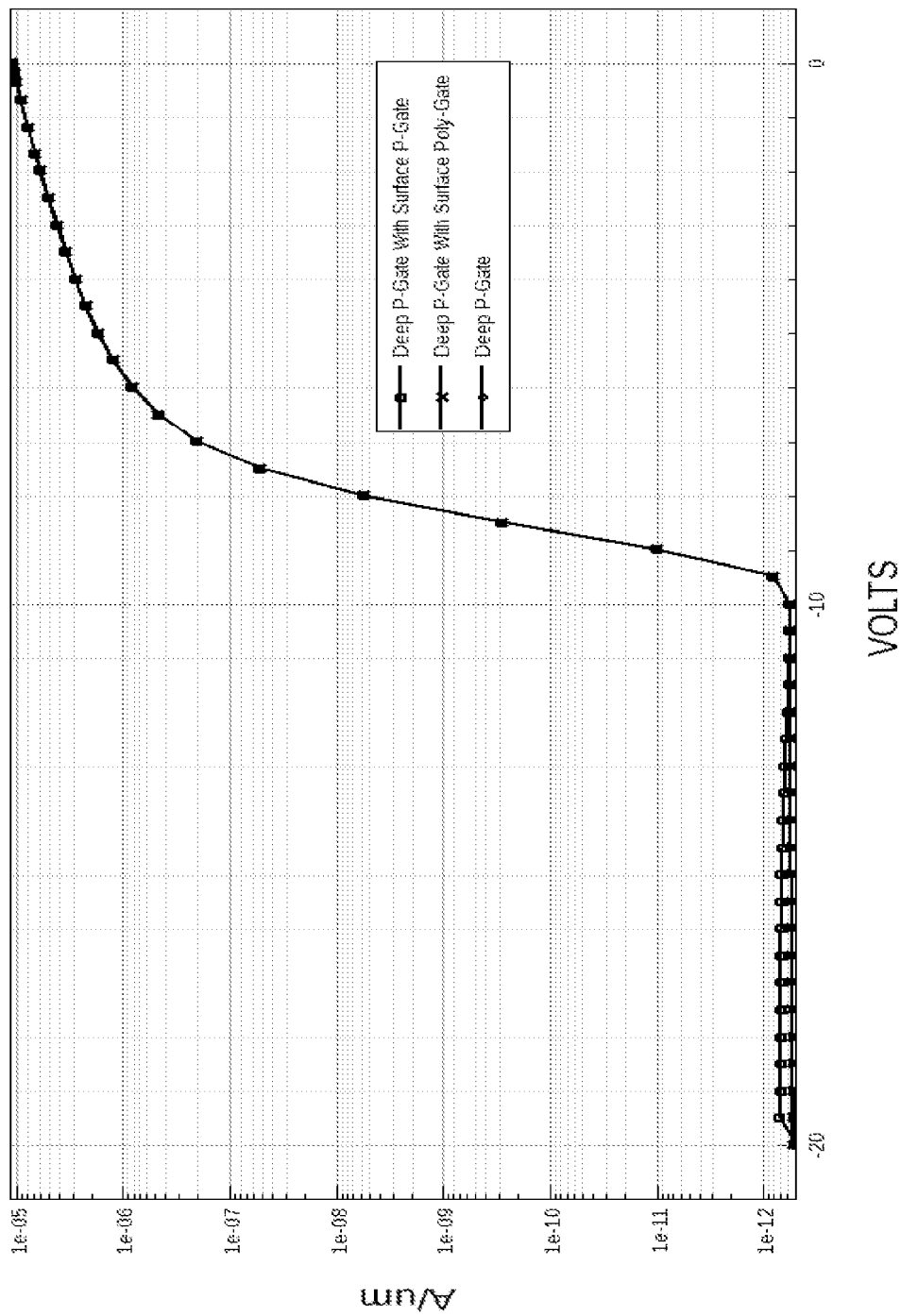
FIG. 6 illustrates simulated drain current as a function of gate voltage for embodiments of SiC planar gate JFETs.

FIG. 6 illustrates simulated drain current as a function of gate voltage for embodiments of SiC planar gate JFETs. The embodiments correspond with device cross section 500 labelled "deep p-gate", device cross section 530 labelled "deep p-gate with surface poly-gate", and device cross section 540 labelled "deep p-gate with surface p-gate". As indicated in FIG. 6, the data further corresponds with the drain to source voltage equal to five volts (5 V).

Figure 7:
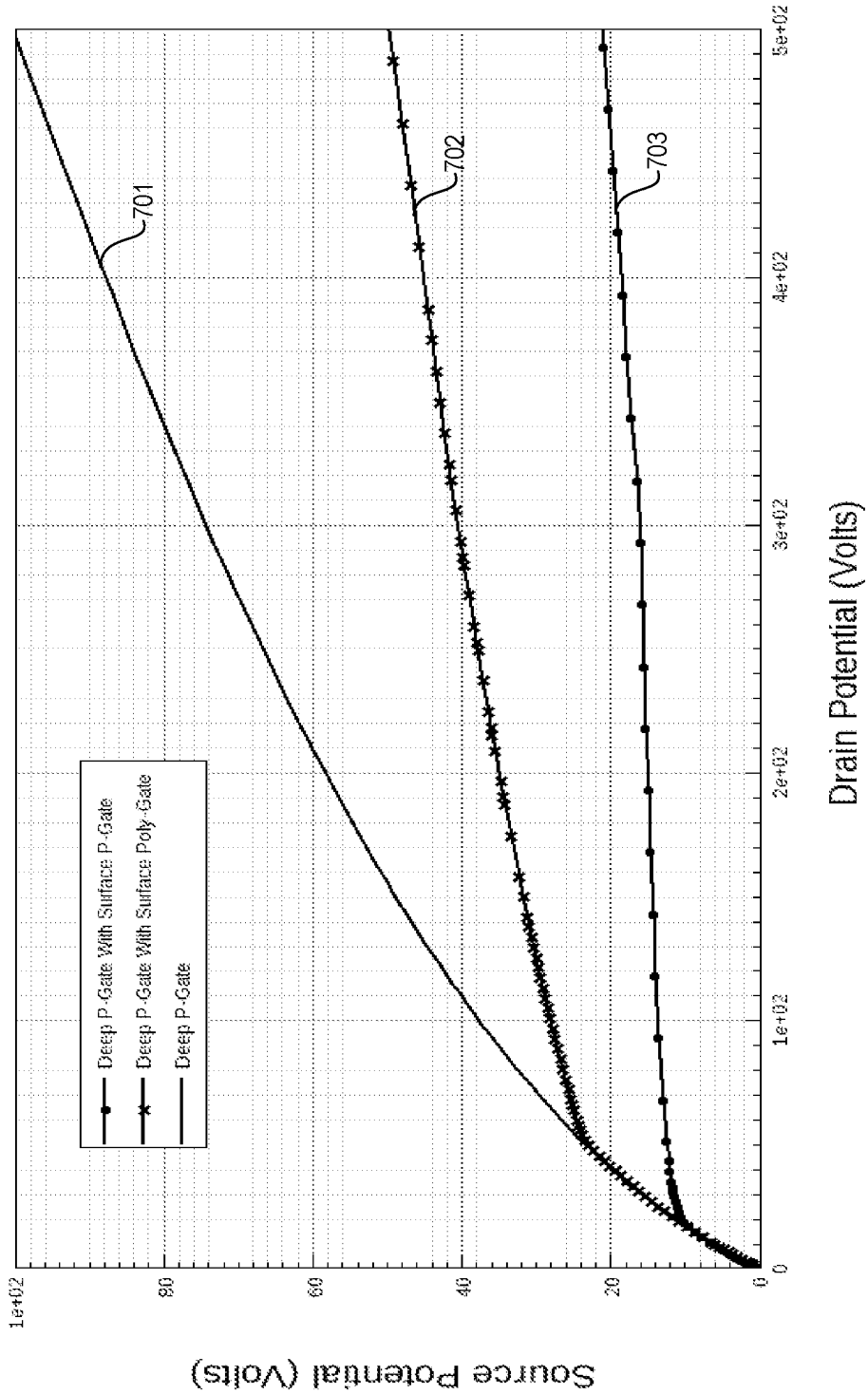
FIG. 7 illustrates source potential as a function of drain potential for embodiments of SiC planar gate JFETs.

FIG. 7 illustrates source potential as a function of drain potential for embodiments of SiC planar gate JFETs. Curves 701, 702, and 703, which correspond respectively with device cross sections 500, 530, and 540, illustrate pinch off behavior. For instance, as shown in FIG. 7, device cross section 540 using both a surface gate 131 and a deep gate 106, achieves superior pinch off control (see, i.e., curve 703); while device cross section 500 using only a deep gate 106, achieves the least pinch off control (see, i.e., curve 701).

In one aspect a silicon carbide (SiC) planar gate junction field effect transistor (JFET) comprises an active cell (e.g., any one of cell device cross sections 100, 101, 130, 140). The active cell comprises a substrate layer (e.g., substrate layer 102), an epitaxial layer (e.g., epitaxial layer 104), a shallow source (e.g., shallow source 108), and a deep gate (e.g., deep gate 106). The epitaxial layer is formed on the substrate layer. The shallow source is implanted within the epitaxial layer. The deep gate is implanted below the shallow source so as to create a JFET neck (e.g., JFET neck 403, 404) within the epitaxial layer.

The epitaxial layer may comprise n-type doping with concentration between 1e14 and 1e16 inverse cubic centimeters. The deep gate may comprise aluminum. The shallow source may comprise nitrogen.

The SiC planar gate JFET may further comprise a termination cell (e.g., cell device cross section 300). The termination cell may comprise the substrate layer, the epitaxial layer, and a deep termination gate (e.g., deep gate 306 and/or deep gate 307). The deep termination gate may be implanted into the epitaxial layer and have the same doping type (e.g., p-type) as the deep gate.

The SiC planar gate JFET may comprise a polysilicon (poly) gate (e.g., poly gate 121). The poly gate may be formed at a surface of the active cell and be electrically coupled to the deep gate. The SiC planar gate JFET may comprise a shallow layer (e.g., shallow layer 124). The shallow layer may be implanted at the surface of the active cell and have the same doping type as the epitaxial layer. The shallow layer may be configured to reduce an on resistance of the SiC planar gate JFET.

The SiC planar gate JFET may further comprise a surface gate (e.g., surface gate 131). The surface gate may be implanted at a surface of the active cell and electrically coupled to the deep gate. The SiC planar gate JFET may comprise a shallow layer (e.g., shallow layer 134) implanted at the surface of the active cell. The shallow layer may be implanted at the surface of the active cell and have the same doping type as the epitaxial layer. The shallow layer may be configured to reduce an on resistance of the SiC planar gate JFET.

The above description of illustrated examples of the present disclosure, including what is described in the Appendix and the Abstract, are not intended to be exhaustive or to be limitation to the precise forms disclosed. While specific embodiments of SiC planar gate JFETs are described herein for illustrative purposes, various equivalent modifications are possible without departing from the broader spirit and scope of the present disclosure. Indeed, it is appreciated that the specific example device cross sections are provided for explanation purposes and that other embodiments may also be employed in accordance with the teachings herein.

Although the present invention is defined in the claims, it should be understood that the present invention can alternatively be defined in accordance with the following examples:

Example 1: A silicon carbide (SiC) planar gate junction field effect transistor (JFET) comprising: an active cell comprising: a substrate layer; an epitaxial layer formed on the substrate layer; a shallow source implanted within the epitaxial layer; and a deep gate implanted below the shallow source so as to create a JFET neck within the epitaxial layer.

Example 2: The SiC planar gate JFET of example 1, wherein the JFET neck comprises a lateral dimension between one-half a micron and two microns.

Example 3: The SiC planar gate JFET of any one of the preceding examples, wherein the epitaxial layer comprises an n-type doping of concentration between 1e14 and 1e16 inverse cubic centimeters.

Example 4: The SiC planar gate JFET of any one of the preceding examples, wherein the deep gate comprises aluminum.

Example 5: The SiC planar gate JFET of any one of the preceding examples, wherein the shallow source comprises nitrogen.

Example 6: The SiC planar gate JFET of any one of the preceding examples further comprising: a termination cell comprising: the substrate layer; the epitaxial layer; a deep termination gate implanted into the epitaxial layer and having the same doping type as the deep gate.

Example 7: The SiC planar gate JFET of any one of the preceding examples further comprising: a polysilicon (poly) gate formed at a surface of the active cell and electrically coupled to the deep gate.

Example 8: The SiC planar gate JFET of any one of the preceding examples further comprising: a shallow layer implanted at the surface of the active cell and having the same doping type as the epitaxial layer, whereby the shallow layer is configured to reduce an on resistance of the SiC planar gate JFET.

Example 9: The SiC planar gate JFET of any one of the preceding examples further comprising: a surface gate implanted at a surface of the active cell and electrically coupled to the deep gate.

Example 10: The SiC planar gate JFET of any one of the preceding examples further comprising: a shallow layer implanted at the surface of the active cell and having the same doping type as the epitaxial layer, whereby the shallow layer is configured to reduce an on resistance of the SiC planar gate JFET.

What is claimed is:

1. A silicon carbide (SiC) planar gate junction field effect transistor (JFET) comprising:
    an active cell comprising:
        a substrate layer;
        an epitaxial layer formed on the substrate layer;
        a shallow source implanted within the epitaxial layer;
        a shallow layer, having a same doping type as the shallow source and implanted at a surface of the active cell;
        a deep gate implanted below the shallow source so as to create a JFET neck within the epitaxial layer
        a polysilicon gate formed at the surface of the active cell and electrically coupled to the deep gate; and
        an oxide layer, wherein a first part of the oxide layer is positioned between the polysilicon gate and the shallow layer and a second part of the oxide layer is positioned above the polysilicon gate.

2. The SiC planar gate JFET of claim 1, wherein the JFET neck comprises a lateral dimension between one-half a micron and two microns.

3. The SiC planar gate JFET of claim 1, wherein the epitaxial layer comprises an n-type doping of concentration between 1e14 and 1e16 inverse cubic centimeters.

4. The SiC planar gate JFET of claim 1, wherein the deep gate comprises aluminum.

5. The SiC planar gate JFET of claim 1, wherein the shallow source comprises nitrogen.

6. The SiC planar gate JFET of claim 1 further comprising:
    a termination cell comprising:
    the substrate layer;
    the epitaxial layer; and
    a deep termination gate implanted into the epitaxial layer.

7. The SiC planar gate JFET of claim 6 wherein the deep termination gate and the deep gate are p-type.

8. The SiC planar gate JFET of claim 1 wherein the polysilicon gate is electrically coupled to the deep gate.

9. The SiC planar gate JFET of claim 8 wherein the shallow layer is configured to reduce an on resistance of the SiC planar gate JFET.

10. The SiC planar gate JFET of claim 9 where the epitaxial layer and the shallow layer are n-type.

11. The SiC planar gate JFET of claim 1 further comprising:
    a surface gate implanted at the surface of the active cell and electrically coupled to the deep gate.

* * * * *